mechanical component, and at least one spring component, via

(12) United States Patent
Weiss et al.

(10) Patent No.: US 8,621,929 B2
(45) Date of Patent: Jan. 7, 2014

(54) MANUFACTURING METHOD FOR A MICROMECHANICAL COMPONENT AND MICROMECHANICAL COMPONENT

(75) Inventors: Stefan Weiss, Tuebingen (DE); Arnim Hoechst, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 462 days.

(21) Appl. No.: 12/898,116

(22) Filed: Oct. 5, 2010

(65) Prior Publication Data
US 2011/0079081 A1    Apr. 7, 2011

(30) Foreign Application Priority Data
Oct. 7, 2009  (DE) .......................... 10 2009 045 428

(51) Int. Cl.
*G01P 15/125*    (2006.01)
(52) U.S. Cl.
USPC ..................................... 73/514.32; 73/514.38
(58) Field of Classification Search
USPC .................... 73/514.32, 514.36, 514.38, 510, 73/514.16, 514.29
See application file for complete search history.

(56) References Cited

U.S. PATENT DOCUMENTS

| 5,060,039 A * | 10/1991 | Weinberg et al. ........... 73/514.24 |
| 5,492,020 A * | 2/1996 | Okada ....................... 73/862.626 |
| 7,640,805 B2 * | 1/2010 | Diamond et al. ........... 73/514.32 |
| 2008/0142914 A1 | 6/2008 | Diamond et al. |
| 2010/0206076 A1* | 8/2010 | Zoellin et al. .............. 73/514.32 |

FOREIGN PATENT DOCUMENTS

DE    10 2007 046 017 A1 *    4/2009

* cited by examiner

*Primary Examiner* — Helen Kwok
(74) *Attorney, Agent, or Firm* — Kenyon & Kenyon LLP

(57) ABSTRACT

A micromechanical component comprising a displaceable mass made of a substrate material having at least one actuator plate electrode and one first insulating layer between the displaceable mass and the at least one actuator plate electrode, a mounting having a frame, which at least partially encloses the displaceable mass, at least one contact terminal of the at least one actuator plate electrode, and at least one stator plate electrode, and at least one spring component, via which the displaceable mass is connected to the mounting, one of the actuator plate electrodes being connected to the assigned contact terminal in each case via the assigned spring component, wherein the frame of the mounting is made of the substrate material of the displaceable mass and wherein one of the actuator plate electrodes is configured in one piece with the assigned contact terminal and the assigned spring component in each case.

7 Claims, 6 Drawing Sheets

MANUFACTURING METHOD FOR A MICROMECHANICAL COMPONENT AND MICROMECHANICAL COMPONENT

RELATED APPLICATION INFORMATION

The present application claims priority to and the benefit of German patent application no. 10 2009 045 428.4, which was filed in Germany on Oct. 7, 2009, the disclosure of which is incorporated herein by reference.

FIELD OF THE INVENTION

The present invention relates to a manufacturing method for a micromechanical component. The present invention also relates to a micromechanical component. Furthermore, the present invention relates to a manufacturing method for a sensor device having the displaceable mass of the micromechanical component as the sensitive element and such a sensor device.

BACKGROUND INFORMATION

An acceleration sensor is frequently configured as a capacitive acceleration sensor. Such a capacitive acceleration sensor typically includes an actuator electrode, which is placed on a displaceable mass, and a stator electrode, which is fixedly connected to a mounting of the acceleration sensor. During acceleration of the capacitive acceleration sensor, a displacement movement of the displaceable mass causes a change in a distance between the electrodes. The acceleration of the acceleration sensor is ascertainable by analyzing a voltage applied between the electrodes.

The electrodes of a capacitive acceleration sensor may be configured as comb structures. As an alternative thereto, US 2008/0142914 A1 describes an acceleration sensor having actuator plate electrodes, which are placed on a diaphragm. Stator plate electrodes are fixedly connected to the mounting of the acceleration sensor adjacent to the actuator plate electrodes. In order to obtain a sufficient change in a curve of the diaphragm during acceleration of the acceleration sensor, a displaceable mass, which is configured as an inertial mass, is attached to the diaphragm.

SUMMARY OF THE INVENTION

The exemplary embodiments and/or exemplary methods of the present invention provides a manufacturing method for a micromechanical component having the features described herein, a manufacturing method for a sensor device having the features described herein, a micromechanical component having the features described herein, and a sensor device having the features described herein.

The manufacturing methods are easily executable in silicon microsystem technology. The ability to execute the manufacturing method is not restricted to structuring the displaceable mass out of a silicon substrate, however. As an alternative or a supplement to silicon, the displaceable mass and the frame may also be made of another substrate material, such as a metal and/or a semiconductor material. For example, MEMS processing may be used to manufacture the micromechanical component.

In one advantageous specific embodiment, at least one through contact is formed, which is continuous through the frame and contacts at least one contact surface of the at least one contact terminal. Such a through contact does not impair the displaceability of the displaceable mass. In addition, the through contact ensures a reliable electrical contact between the at least one contact surface and the second side of the frame, facing away from the electrodes. The frame may thus be installed in a simple manner on the second side on a circuit board or a CMOS chip.

For example, at least one second trench may be produced to form the at least one through contact, the at least one second trench being etched in the first direction in such a way that the at least one contact surface is exposed and/or at least one boundary surface, which encloses the at least one contact surface, of the at least one second trench is formed. This is executable easily and cost-effectively.

The at least one first trench and the at least one second trench may be formed in a joint etching step. Etching of the at least one first trench and the at least one second trench in a joint etching step is to be understood to mean, for example, that a mask is structured, whose through openings correspond to the positions and the widths of the at least one first trench and the at least one second trench. This simplifies the manufacture of the micromechanical component and reduces the manufacturing costs.

The at least one contact surface may be exposed using the at least one second trench. Subsequently, insulating side walls and a conductive core may be formed in the at least one second trench. The manufacture of the at least one through contact is thus easily executable.

As a supplement or an alternative thereto, at least one etching opening may be formed in the at least one stator plate electrode. The at least one etching opening makes it easier to remove at least the partial mass of the second insulating layer. The at least one etching opening may have a diameter between 0.05 μm and 5 μm. An etching opening configured in this way is suitable in particular for a glob top and gelling to seal the micromechanical component against penetration of foreign materials.

The above-described manufacturing method is also usable for manufacturing a sensor device.

The advantages which are described in the preceding paragraphs are also ensured in the case of a corresponding micromechanical component. In the micromechanical component, the at least one spring component may also be used as the line between the assigned actuator plate electrode and the assigned contact terminal. The micromechanical component described here is additionally reducible in its size and its manufacture is simplified due to this multifunctionality of the spring component.

The exemplary embodiments and/or exemplary methods of the present invention allows for a micromechanical component having a mass displaceable in up to three spatial directions. The displaceability of the displaceable mass in three spatial directions may be used, for example, to implement a sensor device having three sensitive directions. For example, a cost-effective acceleration sensor may be configured in this way, using which an acceleration is detectable in all three spatial directions using a single displaceable mass. Due to the comparatively required small installation space and the minor mass of the acceleration sensor, which is configured having only one displaceable mass, it is suitable for a large number of various possible uses.

As described in greater detail hereafter, the micromechanical component may be protected via a glob top and/or with the aid of gelling against penetration of particles and/or a liquid. It is thus not necessary to protect the micromechanical component using a cap, for example, using a silicon cap. In addition to saving material costs, the necessity of a bonding frame is thus also dispensed with. This allows an additional reduction in the required installation space and/or a mass reduction of the micromechanical component.

A sensor device having a micromechanical component including the displaceable mass as the sensitive element of the sensor device, as described above, may be manufactured cost-effectively, requires comparatively little installation space, and has a relatively small mass. The sensor device is therefore suitable for many applications. In particular, the analysis unit of the sensor device may be configured in such a way that an acceleration may be established as information with the aid of the analysis unit taking into account the sensor variable. However, it is to be noted that the use of the sensor device is not restricted to an acceleration sensor.

Further features and advantages of the exemplary embodiments and/or exemplary methods of the present invention are explained hereafter on the basis of the figures.

DETAILED DESCRIPTION

Figure 1:
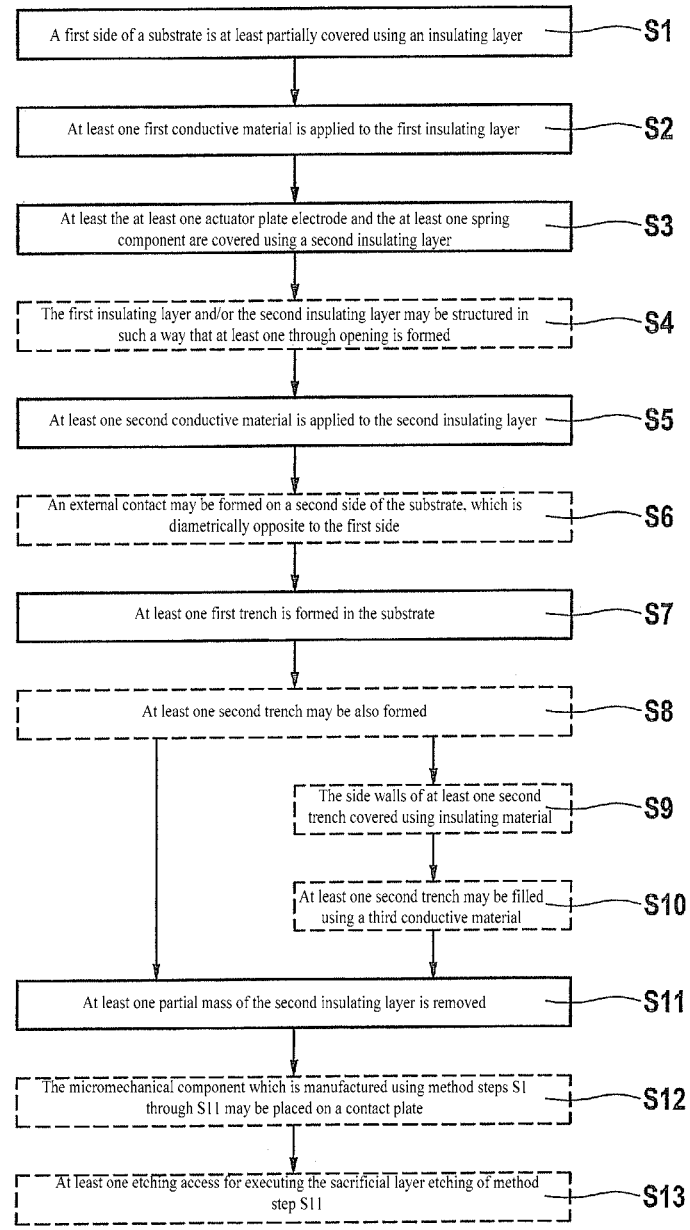
FIG. 1 shows a flow chart to illustrate a specific embodiment of the manufacturing method.

FIG. 1 shows a flow chart to illustrate a specific embodiment of the manufacturing method.

In a method step S1, a first side of a substrate is at least partially covered using an insulating layer. The substrate, which is at least partially covered on the first side, includes a metal and/or a semiconductor material. The substrate may be a silicon substrate, for example. However, the method described here is not restricted to the use of a substrate made of silicon.

The first insulating layer may be an oxide layer, such as silicon oxide. Thermal oxidation of the first side of the substrate may be performed in method step S1. The first insulating layer also functions as the first sacrificial layer. The ability to execute the method described here is simplified by this multifunctionality of the first insulating layer.

A through opening may be formed in the first insulating layer. For example, at least one through opening is etched in the first insulating layer after the thermal oxidation. Parts of the micromechanical component which are formed later may easily be placed directly on the first side of the substrate by forming the at least one through opening in the first insulating layer.

In a further method step S2, at least one first conductive material is applied to the first insulating layer. At least one actuator plate electrode, at least one actuator contact terminal, and at least one spring component are formed from at least the first conductive material. At least one of the actuator plate electrodes is connected via the particular spring component to the assigned actuator contact terminal.

The at least one spring component may be structured/formed in such a way that the actuator plate electrode connected thereto is displaceable using a comparatively small force with respect to the assigned actuator contact terminal.

For example, a doped semiconductor layer and/or a metal may be deposited and structured as the first conductive material. Suitable semiconductor materials are germanium and/or silicon. A doped polysilicon layer may be formed.

In particular, the at least one through opening in the first insulating layer may be at least partially filled with at least the first conductive material in method step S2. The at least one actuator contact terminal may thus be placed directly on the first side of the substrate in a simple way. The advantage of such a configuration of the at least one actuator contact terminal will become apparent hereafter.

In a subsequent method step S3, at least the at least one actuator plate electrode, the at least one actuator contact terminal, and the at least one spring component are covered using a second insulating layer. The second insulating layer may also include an oxide, such as silicon oxide. However, the method described here is not restricted to the exclusive use of silicon oxide as the material for the first insulating layer and/or the second insulating layer. The second insulating layer also has the additional functionality of a second sacrificial layer, which simplifies the ability to execute the manufacturing method.

In an optional method step S4, the first insulating layer and/or the second insulating layer may be structured in such a way that at least one through opening is formed, which advantageously exposes a partial surface of the first side of the substrate. In a subsequent method step, at least one component may be formed/placed directly on the first side of the substrate on the at least one exposed partial surface.

As an alternative or a supplement to forming at least one through opening in the first insulating layer and/or the second insulating layer, at least one depression may also be formed in the second insulating layer in method step S4. Method step S4 may include two etching steps, for example. As explained in greater detail hereafter, the at least one depression in the second insulating layer may be used as a negative/form specification for forming at least one stop on a stator plate electrode formed hereafter.

Subsequently, at least one second conductive material is applied to the second insulating layer in a method step S5. The second conductive material may be a metal and/or a semiconductor material, such as germanium and/or silicon. A second doped polysilicon layer may be deposited as the second conductive material. At least one stator plate electrode is formed from at least the second conductive material. In addition, at least one stator contact terminal may also be structured from at least the second conductive material, each stator contact terminal being formed in one piece with the assigned stator plate electrode. The at least one stator contact terminal may be placed directly on the first side of the substrate in at least one of the through openings in the first insulating layer and/or the second insulating layer. This makes the formation of a through contact on the at least one stator contact terminal in a subsequent method step easier.

During the structuring of the at least one second conductive material to form the at least one stator plate electrode, etching accesses may also be applied for later sacrificial layer etching. In particular, at least one etching opening may be formed in the at least one stator plate electrode. The at least one etching opening may have a diameter in a range between 0.05 µm and 5 µm. The at least one stator plate electrode is advantageously formed having a maximum thickness, facing perpendicularly to the first side, which is less than 8 µm, advantageously less than 5 µm, in particular less than 2 µm. This is easily executable in that the material/materials which is/are applied in method step S5 to the second insulating layer is/are deposited having a total thickness less than 8 µm, advantageously less than 5 μm, in particular less than 2 μm. The advantages of a diameter of the at least one etching opening of the at least one stator plate electrode in this range and the comparatively low maximum thickness are discussed in greater detail hereafter.

In an advantageous specific embodiment, in addition to the second conductive material, a nonconductive material is also applied to the second insulating layer in method step S5. The nonconductive material may be a (moderately pressure-tensioned) silicon-rich nitride layer, for example. The second conductive material, such as, for example, a second doped polysilicon layer, may be structured/deposited in this case in such a way that the second conductive material is only used for forming electron surfaces of the at least one stator plate electrode, a contact surface of the at least one stator contact terminal on the first side, and/or at least one conductive layer which connects a contact surface to an assigned electron surface. In particular, the at least one depression in the second insulating layer may be filled with the nonconductive material. At least one stop made of the nonconductive material may thus be formed in a simple way on the at least one stator plate electrode. Such stops may prevent sticking between the at least one actuator plate electrode and the at least one stator plate electrode during later operation of the micromechanical component. In particular, a current flow between the electrodes is prevented due to the insulating properties of the stops. The stops thus also contribute to preventing welding of the electrodes.

In an optional method step S6, an external contact may be formed on a second side of the substrate, which is diametrically opposite to the first side. For this purpose, a material suitable for electrical contact, for example, a metal and/or a doped semiconductor material, may be deposited and structured on the second side. Method step S6 may also be executed before or between method steps S1 through S5.

In a method step S7, at least one first trench is formed in the substrate. Using the at least one first trench, a displaceable mass (inertial mass) and a frame, which at least partially encloses the displaceable mass, of a mounting of the micromechanical component formed thereafter are structured out of the substrate. The displaceable mass is/remains connected via the at least one spring component to the mounting in such a way that the displaceable mass is displaceable in relation to the mounting. Etching is performed in a first direction from the second side to the first side for suitable structuring of the displaceable mass and the mounting. This may also be referred to as rear side etching. A suitable etching process is, for example, deep reactive ion etching (DRIE).

At least one second trench may be also formed in a method step S8, which is etched continuously through the substrate in the first direction from the second side to the first side. The etching of the at least one second trench is performed to form at least one through contact, via which a stator contact terminal or an actuator contact terminal on the first side may be contacted. The formation of the at least one first trench and the at least one second trench may be executed in a (joint) etching step, for example, in a DRIE etching step, using only one mask. The structuring of the mask may correspond to the positions and widths of the at least one first trench and the at least one second trench. Method steps S8 and S9 may thus be executed simultaneously. Such a manufacturing method is executable comparatively simply and cost-effectively. As an alternative thereto, the formation of the at least one second trench may be performed in a further etching step before or after the at least one first trench has been formed.

Procedures for forming two different structures of through contacts are described hereafter:

In the first procedure, the at least one second trench is etched through the substrate in such a way that at least one contact surface, which contacts the first side of the substrate, of the at least one actuator contact terminal and/or stator contact terminal is framed by at least one floor/one boundary surface of the at least one second trench. In this case, the areas made of the substrate material, which are enclosed by the at least one second trench, may be used as the through contacts themselves. In order to ensure a good conductivity through the through contacts, which are adequately electrically insulated from the surrounding frame via the at least one second trench, doping of the areas made of the substrate material may be executed before or after method step S7. The at least one second trench may also be filled using an insulating material, in order to improve the electrical insulation. The formation of the at least one through contact may also be restricted to the etching of the at least one second trench, which is described in this paragraph.

In the second procedure, the at least one second trench is formed in such a way that the at least one later contact surface is exposed. In this case, to form the at least one conductive contact, at least the side walls of the at least one second trench are covered using an insulating material in a further method step S9. Subsequently, in a method step S10, the at least one second trench may be filled using a third conductive material, such as, for example, a metal and/or a doped semiconductor material, after the covering of at least the side walls using the insulating material. Method steps S9 and S10 offer easily executable possibilities for forming a conductive contact having a conductive core and insulating side walls.

Before, during, or after method steps S7 through S10, in a method step S11, at least one partial mass of the second insulating layer, which lies between the at least one actuator plate electrode and the at least one stator plate electrode, is removed. Etching is performed in a second direction from the first side to the second side of the substrate. Further areas of the first insulating layer and/or the second insulating layer may also be removed via the sacrificial layer etching in method step S11. If at least one of the two insulating layers includes an oxide, such as, for example, silicon oxide, method step S11 may include HF gas-phase etching. Method step S11 is thus easily executable, without the electrodes and the parts connected thereto being damaged. In particular, the at least one etching opening, which is placed in the at least one stator plate electrode, may make it easier to execute the etching. At a maximum thickness of the at least one stator plate electrode of less than 8 μm, advantageously less than 5 μm, in particular less than 2 μm, a diameter of the at least one etching opening in the range between 0.05 μm and 5 μm is already sufficient.

A cavern is formed in method steps S7 and S11, in which the displaceable mass, which is structured out of the substrate, is deflectably placed. In the case of a suitable implementation of the at least one spring component, in particular a displaceability of the displaceable mass in all three spatial directions is ensured. The advantages of a micromechanical component having such a freely displaceable mass will be described on the basis of the further figures.

In a further optional method step S12, the micromechanical component which is manufactured using method steps S1 through S11 may be placed on a contact plate. The contact plate may be a circuit board or a complementary metal oxide semiconductor (CMOS chip), on which the micromechanical component is directly installed. Spacers, in particular conductive spacers (bump technology), may be used for mechanical and/or electrical contacting of the micromechanical component placed on the contact plate. The contact plate may additionally have at least one wire connection.

Optionally, in a method step S13, at least one etching access for executing the sacrificial layer etching of method step S11, such as, for example, the at least one etching opening, may also be sealed airtight using a sealing layer. For example, a PECVD nitride (plasma enhanced chemical vapor deposition) may be deposited as the sealing layer. Penetration of foreign particles during later operation of the micromechanical component may be prevented using the sealing layer. In particular small etching accesses having diameters in the range between 0.05 μm and 5 μm have advantageous effects, since penetration of material of the sealing layer is prevented due to the small diameter of the etching accesses. The sealing layer may have a layer thickness in a range between 1 μm and 5 μm, for example. As an alternative thereto, the micromechanical component may be extrusion coated using a glob top and/or using a gel. Such capping reliably protects the micromechanical component against penetration of foreign particles. In addition, such capping ensures a better hold of the micromechanical component on the contact plate. Small etching accesses having diameters in the range between 0.05 μm and 5 μm also prevent the penetration of material in the case of capping.

In a refinement of the manufacturing method described in the preceding paragraphs, still further layers may be deposited for wafer bow minimization. In addition to the above-mentioned materials, for example, a structured, highly tensioned nitride may be formed between the substrate and the first insulating layer. A tension of the first insulating layer may be compensated for in this way. A pressure-tensioned oxide may also be applied to the second side of the substrate as an alternative or supplement to the highly tensioned nitride.

As an alternative or supplement, the semiconductor areas of the electrodes may be doped like diodes in the refinement. For example, the at least one actuator plate electrode is doped using ions of a first conduction type and the at least one stator plate electrode is doped using ions of a second charge type, which differs from the first conduction type. The diode-like doping of the electrodes additionally contributes to preventing a current flow between the electrodes, and thus welding of the electrodes.

Figure 2A:
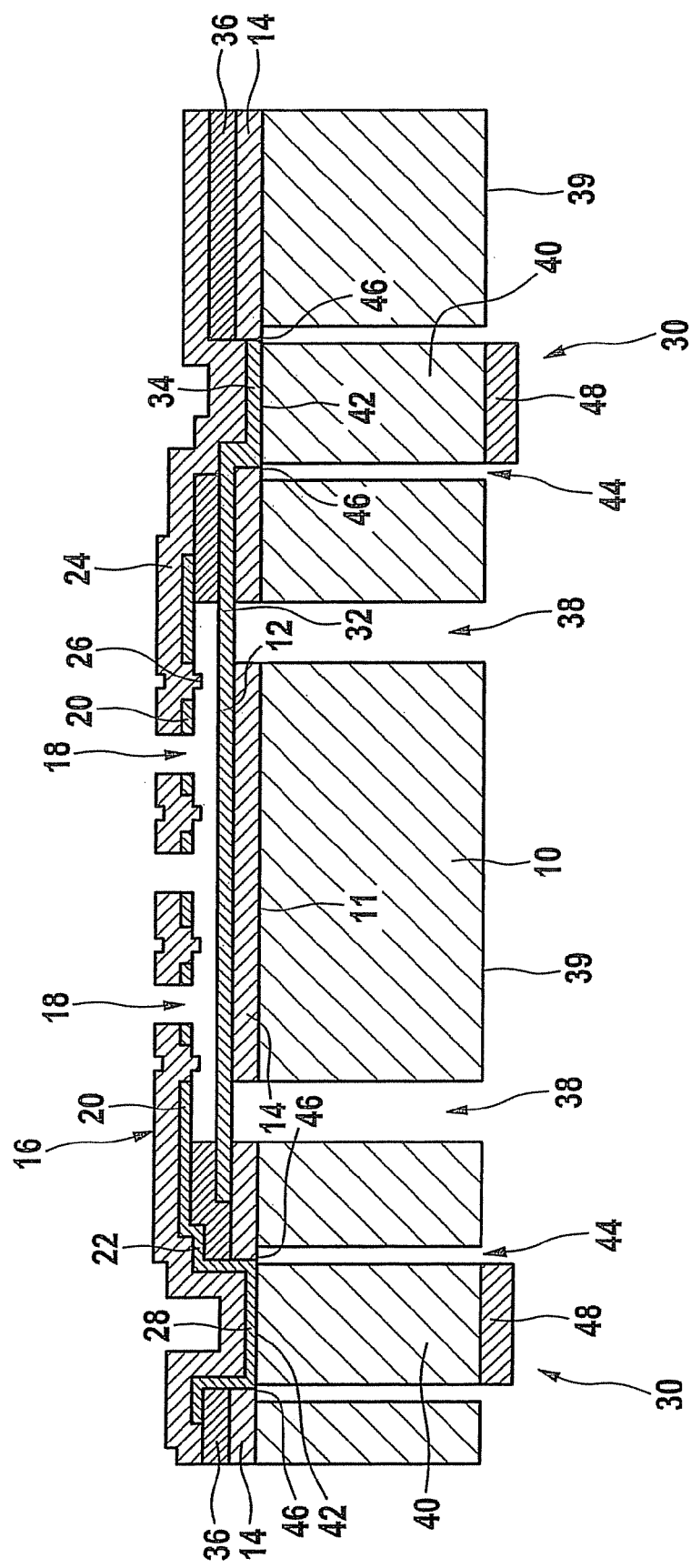
FIG. 2A shows a cross section of a first specific embodiment of the micromechanical component.
Figure 2B:
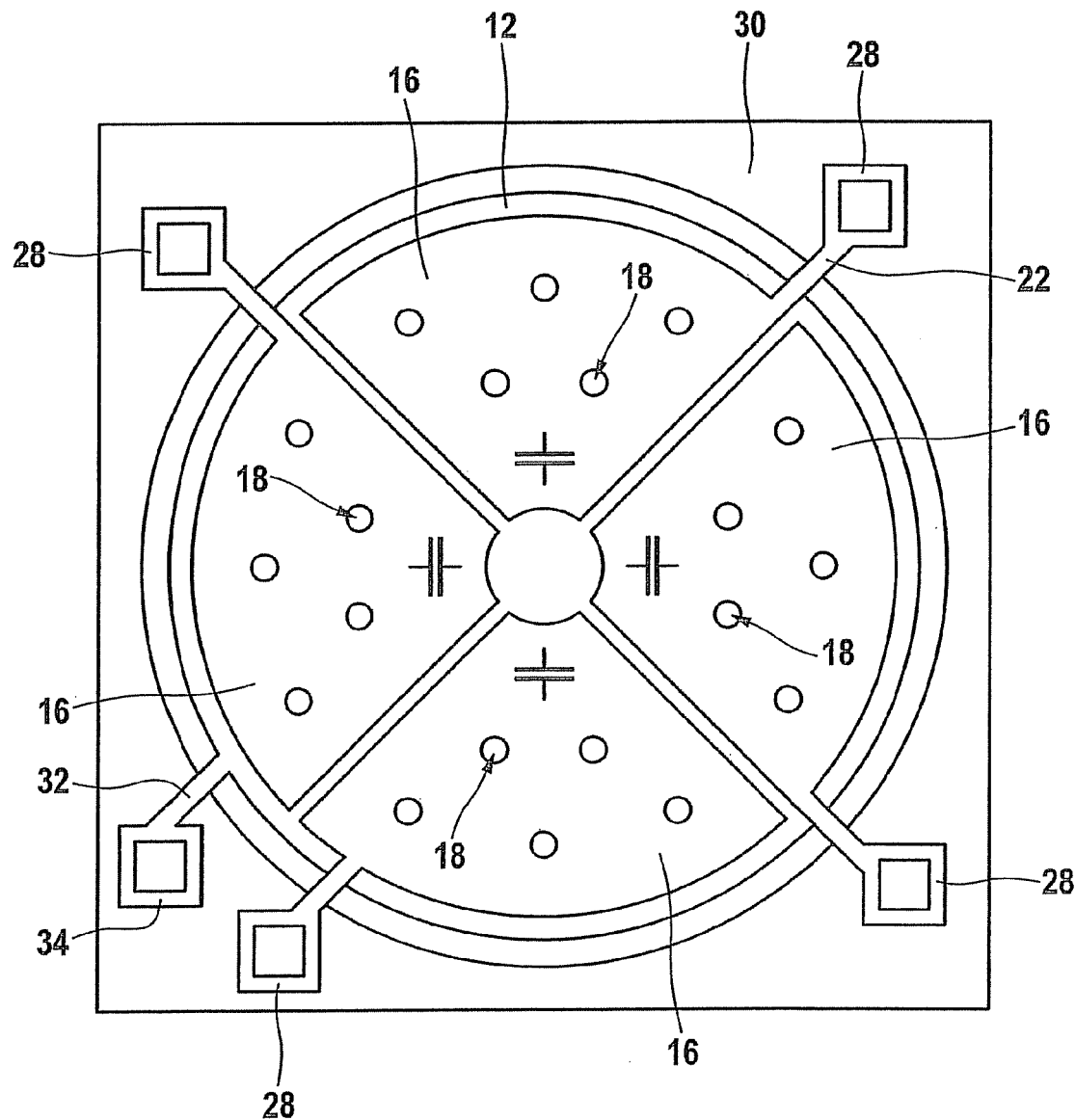
FIG. 2B shows a top view of a first specific embodiment of the micromechanical component.

FIGS. 2A and 2B show a cross section and a top view of a first specific embodiment of the micromechanical component.

The micromechanical component which is schematically shown in FIGS. 2A and 2B includes a displaceable mass (inertial mass) 10, which is displaceable in relation to a mounting of the micromechanical component. Displaceable mass 10 is made of a substrate material, such as silicon, for example. At least one actuator plate electrode 12 is placed on a first side 11 of displaceable mass 10. At least partial areas of a first insulating layer 14 are between the at least one actuator plate electrode 12 and displaceable mass 10.

At least one stator plate electrode 16 is fixedly connected to the mounting of the micromechanical component adjacent to the at least one actuator plate electrode 12. Four stator plate electrodes 16 may be placed spaced apart from the at least one actuator plate electrode 12 or four actuator plate electrodes 12 are placed spaced apart from the at least one stator plate electrode 16. In this case, a movement of displaceable mass 10 in all three spatial directions is detectable via an analysis of the voltages applied between electrodes 12 and 16, or the capacitances of the capacitors which are formed by electrodes 12 and 16.

In an advantageous specific embodiment of the micromechanical component, the at least one stator plate electrode 16 may have at least one etching opening 18. Introducing at least one etching opening 18 into the at least one stator plate electrode 16 makes the manufacture of the micromechanical component which is described here easier. The at least one etching opening 18 may have a diameter in a range between 0.05 μm and 5 μm. Implementing the at least one etching opening 18 in this way prevents penetration of a sealing material.

The at least one stator plate electrode 16 may include still another material, in addition to a conductive material, from which at least electrode surfaces 20 are formed. Only electrode surfaces 20 and conductive layers 22, which contact electrode surfaces 20, may be made of a conductive material, such as doped polysilicon, for example. Further parts of the at least one stator plate electrode 16, in particular an external frame 24, may be made of an insulating material. This makes it easier to manufacture the at least one stator plate electrode 16 having a comparatively small maximum width perpendicular to first side 11 of less than 8 μm, advantageously less than 5 μm, in particular less than 3 μm.

At least one stop 26 may be placed on a side of the at least one stator plate electrode 16 facing toward the at least one actuator plate electrode 12. Sticking of electrodes 12 and 16 may be prevented with the aid of such stops 26. In particular, stops 26 may be made of the insulating material of external frame 24. A current flow between electrodes 12 and 16 is prevented in this way, even upon striking of electrodes 12 and 16. Welding of electrodes 12 and 16, which contact one another, is thus prevented.

The at least one stator plate electrode 16 is connected at least via conductive layer 22 to an assigned stator contact terminal 28. The at least one stator contact terminal 28 may be placed directly on a frame 30 of the mounting. The at least one actuator plate electrode 12 is also connected via at least one spring component 32 to at least one assigned actuator contact terminal 34, which may be fastened directly on the frame. The at least one stator contact terminal 28 and the at least one actuator contact terminal 34 may be covered by the insulating material of external frame 24. This improves the multifunctionality of external frame 24. In order to additionally prevent a current flow between electrodes 12 and 16, partial areas of actuator contact terminal 34 and/or actuator plate electrode 12 may also be enclosed by a second insulating layer 36, whose mean layer thickness defines a mean distance of the electrode surfaces of electrodes 12 and 16.

Frame 30 of the mounting is made of the substrate material of displaceable mass 10. Frame 30 is separated from displaceable mass 10 using at least one first trench 38. Displaceable mass 10 may thus be placed in a particular position inside frame 30 via structuring out of the substrate material during manufacture of the micromechanical component. Complex alignment/fastening of displaceable mass 10 in the micromechanical component is dispensed with. First trench 38 runs to first side 11 at least from a second side 39 of displaceable mass 10 and frame 30, facing away from electrodes 12 and 16.

Displaceable mass 10 is connected to the mounting via the at least one spring component 32. At least one of actuator plate electrodes 12, assigned actuator contact terminal 34, and interposed spring component 32 are configured in one piece. Such a design of components 12, 32, and 34 makes the manufacture of the micromechanical component easier.

In the specific embodiment of FIGS. 2A and 2B, the micromechanical component has a through contact 40 for each contact terminal 28 and 34, which contacts a contact surface 42 of assigned contact terminal 28 and 34 continuously through frame 30 from second side 39. A contact surface is to be understood as a surface of particular contact terminal 28 or 34 which contacts first side 11 of frame 30. At least one of through contacts 40 may be structured out of frame 30 using a second trench 44. Adjacent to assigned contact terminal 28 or 34, second trench 44 has a boundary surface 46/floor surface, which frames contact surface 42 of assigned contact terminal 28 or 34. To improve the conductivity of conductive contact 40, the substrate material framed by the second trench may be doped. Such a through contact 40 may be manufactured cost-effectively and in a simple manner. An external contact 48 may be made of a conductive material on an end facing away from contact surface 42.

The micromechanical component described in the preceding paragraphs may be manufactured simply and cost-effectively using the manufacturing method described on the basis of FIG. 1. One possible use of the micromechanical component will be discussed hereafter.

Figure 3:
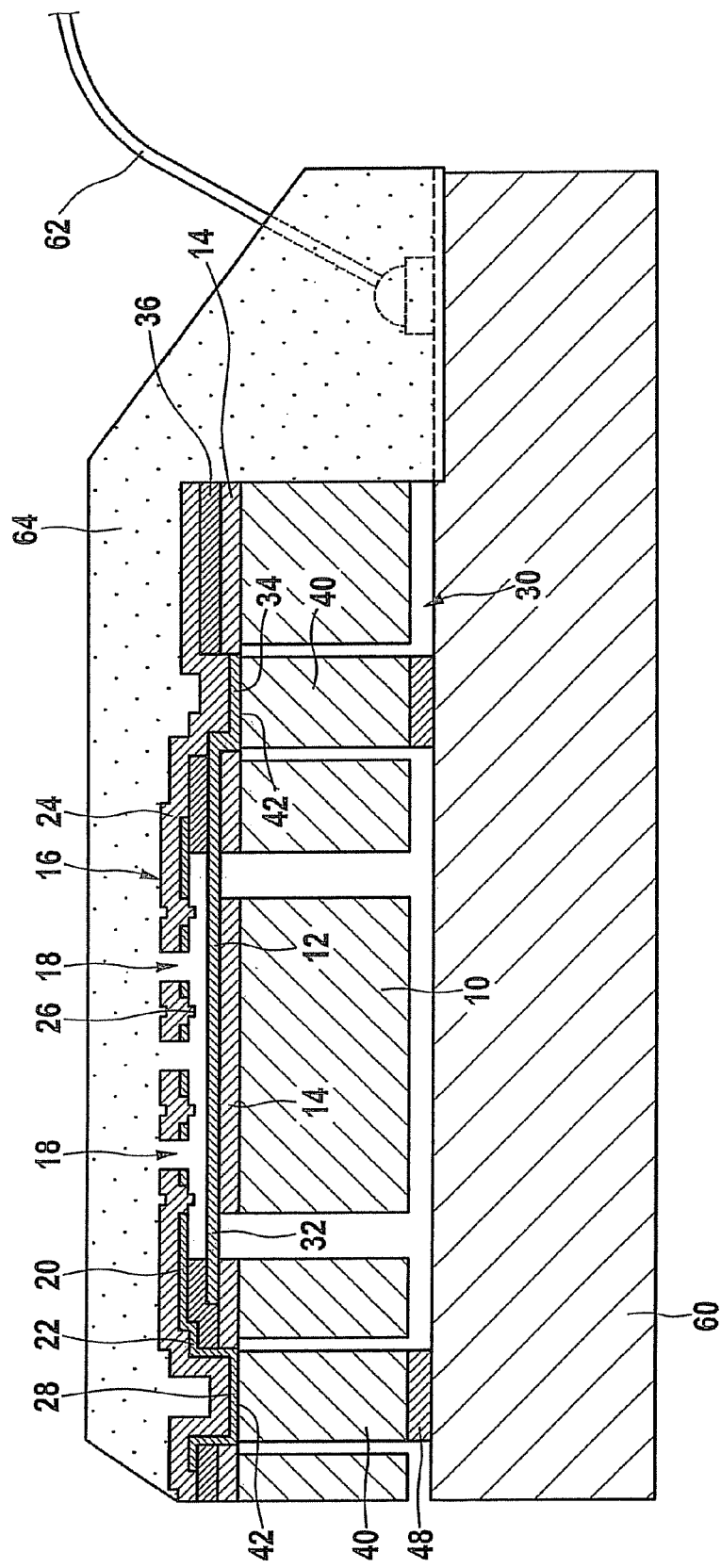
FIG. 3 shows a cross section through a specific embodiment of the sensor device.

FIG. 3 shows a cross section through one specific embodiment of the sensor device.

The schematically shown sensor device includes the above-described micromechanical components having parts 10 through 48. The micromechanical component is connected to a contact plate 60 via external contacts 48, which are configured as conductive spacers. External contacts 48 advantageously also allow an electrical contact between the micromechanical component and contact plate 60, in addition to the mechanical fastening. Contact plate 60 may be a circuit board or a complementary metal oxide semiconductor (CMOS chip), for example.

In the illustrated specific embodiment, contact plate 60 is connected via a wire connection 62 to an analysis unit. The analysis unit may be configured in such a way that a sensor variable with respect to a voltage signal, which is applied between the at least one stator plate electrode 16 and the at least one actuator plate electrode 12, or with respect to a capacitance of the at least one capacitor, which is formed by electrodes 12 and 16, is ascertainable with the aid of the analysis unit. The analysis unit may be additionally configured for the purpose of providing information with respect to a displacement movement of the displaceable mass in relation to the mounting, taking into account the ascertained sensor variable. In one specific embodiment, the analysis unit is configured in such a way that an acceleration of the sensor device may be established as information with the aid of the analysis unit, taking into account the ascertained sensor variable. Due to the good displaceability of displaceable mass 10 in relation to the mounting, the acceleration may be established in particular with respect to all three spatial directions. However, it is to be noted here that the sensor device is not restricted to a design as an acceleration sensor.

In order to protect the micromechanical component against penetration of foreign particles during operation of the sensor device, the micromechanical component is extrusion coated using a sealing material 64. A suitable sealing material may include a glob top or a gel, for example.

Figure 4:
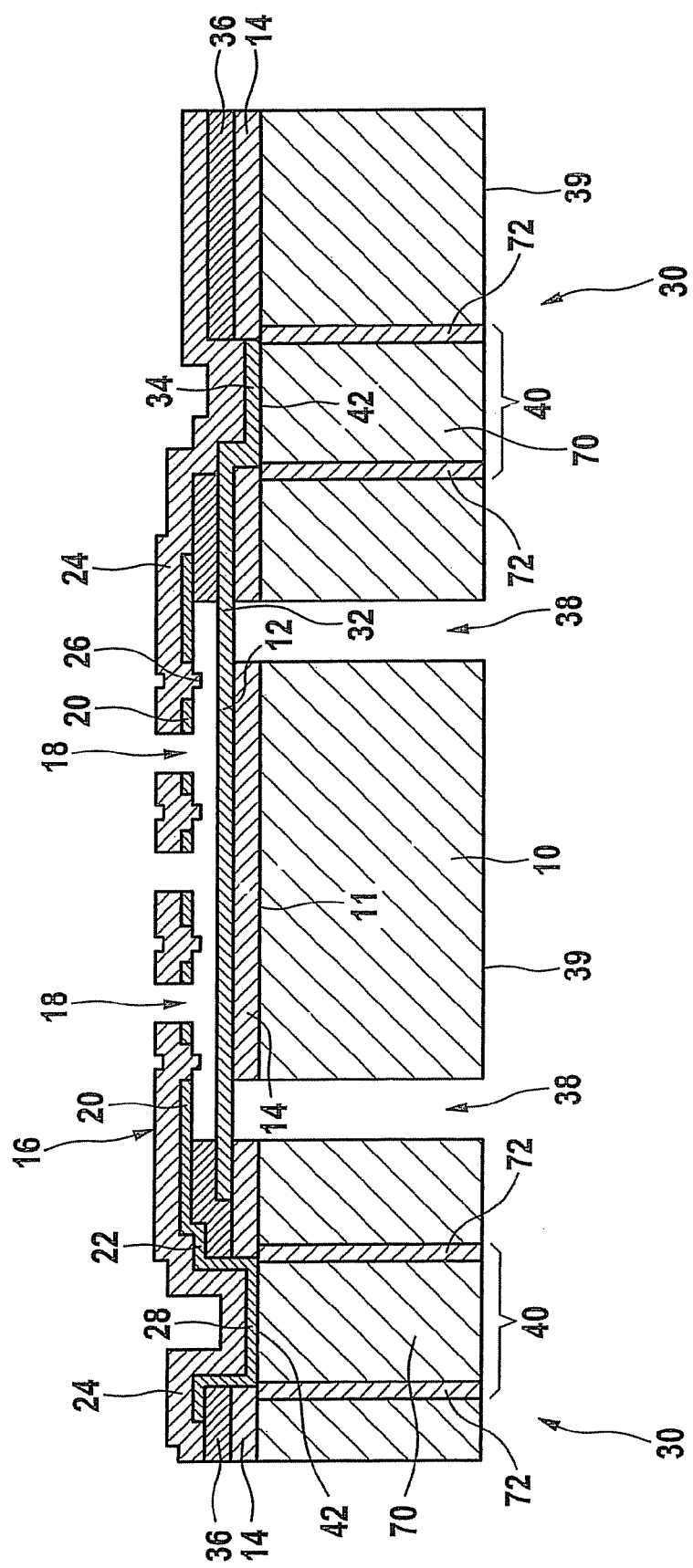
FIG. 4 shows a cross section through a second specific embodiment of the micromechanical component.

FIG. 4 shows a cross section through a second specific embodiment of the micromechanical component.

The schematically shown micromechanical component has above-described parts 10 through 40. In contrast to the micromechanical component of FIGS. 2A and 2B, through contacts 40 of the micromechanical component of FIG. 4 each have a conductive core 70 and insulating side walls 72. Side walls 72 made of the insulating material may be implemented in such a way that they cover the boundary surfaces of conductive core 20 facing toward frame 30.

An electrical connection between a contact terminal 28 or 34 and second side 39 of frame 30 is also implemented in a through contact 40 having a conductive core 70 and insulating side walls 72. Through contact 40 implemented in this way may be manufactured in a simple way and cost-effectively with the aid of the above-described method steps. Electroplating is optionally used for filling up conductive contact 40/forming conductive core 70. A refill may also be used as conductive core 70, which reduces the resistance of conductive contact 40.

Figure 5:
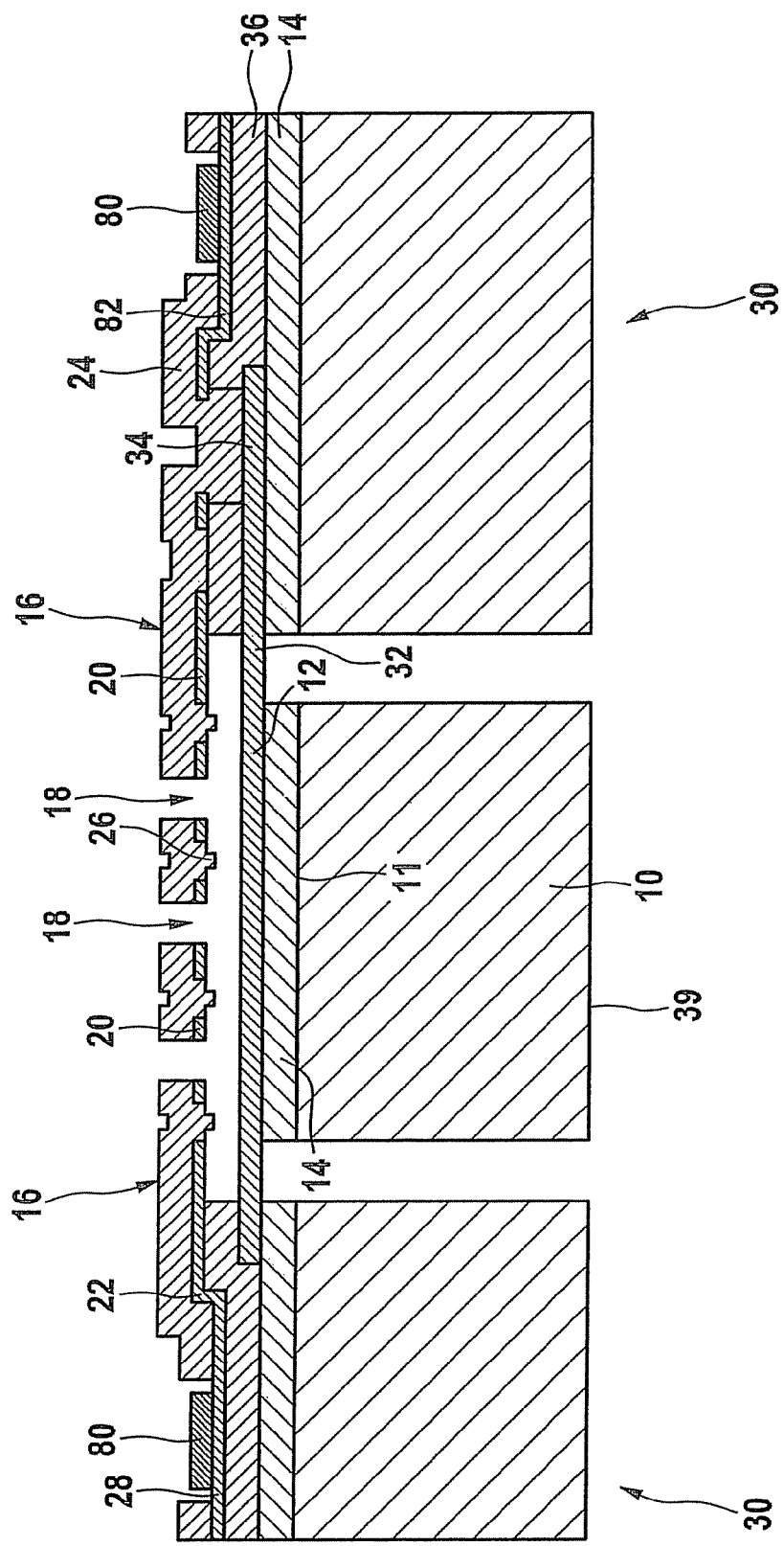
FIG. 5 shows a cross section through a third specific embodiment of the micromechanical component.

FIG. 5 shows a cross section through a third specific embodiment of the micromechanical component.

The micromechanical component which is schematically shown in FIG. 5 has all parts of the preceding specific embodiments except for the through contacts through frame 30. Instead of the through contacts, aluminum pads 80, which contact the contact terminals, are formed adjacent to an outer side of the at least one stator plate electrode. A further conductive layer 82 may project into a recess in second insulating layer 36 for an electrical contact between an aluminum pad 80 and assigned actuator contact terminal 34. The micromechanical component described here may thus also be manufactured via the classical bond pad technology.

In a refinement of the micromechanical components which are described on the basis of FIGS. 2A, 2B, 4, and 5, semiconductor areas of the electrodes 12 and 16 may be doped like diodes. The at least one actuator plate electrode 12 may have p-doping, for example. In this case, n-doping is advantageous for the at least one stator plate electrode 16. Correspondingly, in the case of n-doping of the at least one actuator plate electrode 12, the at least one stator plate electrode 16 may have p-doping. In both cases, electrodes 12 and 16 form a diode in case of contact, in which the charge voltage is polarized in such a way that the diode is switched in its blocking direction. Due to the suppressed current flow between electrodes 12 and 16, welding of electrodes 12 and 16 is prevented. The semiconductor areas of electrodes 12 and 16 may be formed using an epipoly process, for example.

What is claimed is:

1. A micromechanical component, comprising:
  a displaceable mass made of a substrate material having at least one actuator plate electrode and one first insulating layer between the displaceable mass and the at least one actuator plate electrode;
  a mounting having a frame, which at least partially encloses the displaceable mass, at least one contact terminal of the at least one actuator plate electrode, and at least one stator plate electrode; and
  at least one spring component, via which the displaceable mass is connected to the mounting, one of the actuator plate electrodes being connected to the assigned contact terminal in each case via the assigned spring component;
  wherein the frame of the mounting is made of the substrate material of the displaceable mass, and
  wherein one of the actuator plate electrodes is configured in one piece with the assigned contact terminal and the assigned spring component in each case.

2. The micromechanical component of claim 1, wherein the micromechanical component includes at least one through contact, which is continuous through the frame, and which contacts at least one contact surface of the at least one contact terminal.

3. The micromechanical component of claim 2, wherein the at least one through contact includes a conductive core and insulating side walls.

4. The micromechanical component of claim 2, wherein the at least one through contact is structured out of the frame using at least one trench having at least one boundary surface, which frames the at least one contact surface of the at least one contact terminal.

5. The micromechanical component of claim 1, wherein the at least one stator plate electrode has at least one etching opening.

6. A sensor device, comprising:
- a micromechanical component having a displaceable mass as a sensitive element of the sensor device; and
- the displaceable mass made of a substrate material having at least one actuator plate electrode and one first insulating layer between the displaceable mass and the at least one actuator plate electrode;
- a mounting having a frame, which at least partially encloses the displaceable mass, at least one contact terminal of the at least one actuator plate electrode, and at least one stator plate electrode; and
- at least one spring component, via which the displaceable mass is connected to the mounting, one of the actuator plate electrodes being connected to the assigned contact terminal in each case via the assigned spring component;
- wherein the frame of the mounting is made of the substrate material of the displaceable mass, and
- wherein one of the actuator plate electrodes is configured in one piece with the assigned contact terminal and the assigned spring component in each case; and
- an analysis unit, which is configured so that a sensor variable with respect to a voltage signal, which is applied between the at least one stator plate electrode and the at least one actuator plate electrode, is detectable with the aid of the analysis unit and information with respect to a displacement movement of the displaceable mass in relation to the mounting may be established, taking into account the sensor variable.

7. The sensor device of claim 6, wherein the analysis unit is configured so that an acceleration may be established as the information with the aid of the analysis unit, taking into account the sensor variable.

* * * * *